US007705341B2

(12) United States Patent
Chang

(10) Patent No.: US 7,705,341 B2
(45) Date of Patent: Apr. 27, 2010

(54) PHASE CHANGE MEMORY DEVICE USING PNP-BJT FOR PREVENTING CHANGE IN PHASE CHANGE LAYER COMPOSITION AND WIDENING BIT LINE SENSING MARGIN

(75) Inventor: Heon Yong Chang, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 140 days.

(21) Appl. No.: 11/938,909

(22) Filed: Nov. 13, 2007

(65) Prior Publication Data

US 2008/0277643 A1    Nov. 13, 2008

(30) Foreign Application Priority Data

May 11, 2007    (KR) ...................... 10-2007-0046132

(51) Int. Cl.
*H01L 29/02* (2006.01)
(52) U.S. Cl. .................. 257/2; 257/3; 257/4; 257/5; 257/E29.002; 438/102; 438/103; 365/163
(58) Field of Classification Search ................ 257/1–5, 257/E29.002; 438/102–103; 365/163
See application file for complete search history.

(56) References Cited

U.S. PATENT DOCUMENTS 4,495,512 A * 1/1985 Isaac et al. .................. 257/588

2004/0150093 A1* 8/2004 Pellizzer et al. ............. 257/695
2006/0226459 A1* 10/2006 Oh et al. ..................... 257/296

FOREIGN PATENT DOCUMENTS

| JP | 2004-110867 A | 4/2004 |
|----|---------------|--------|
| KR | 1020060090744 A | 8/2006 |
| KR | 10-0621774 B1 | 9/2006 |

* cited by examiner

*Primary Examiner*—Bradley K Smith
*Assistant Examiner*—Jami M Valentine
(74) *Attorney, Agent, or Firm*—Ladas & Parry LLP

(57) ABSTRACT

A phase change memory device includes a semiconductor substrate having bar-shaped active regions which extend in a first direction; base regions and emitter regions alternately formed in each active region; lower electrodes formed over the emitter regions to connect to the respective emitter regions; a phase change layer and an upper electrode stacked on each of the lower electrodes; sub bit lines formed over the upper electrodes to come into contact with the corresponding upper electrodes; word lines arranged over the sub bit lines to come into contact with the base regions; and a main bit line formed over the word line to come into contact with the sub bit lines. The phase change memory device is able to prevent a change in the composition of the phase change layer and additionally is able to widen the sensing margin of a bit line.

19 Claims, 14 Drawing Sheets

PHASE CHANGE MEMORY DEVICE USING PNP-BJT FOR PREVENTING CHANGE IN PHASE CHANGE LAYER COMPOSITION AND WIDENING BIT LINE SENSING MARGIN

CROSS-REFERENCE TO RELATED APPLICATIONS

The present application claims priority to Korean patent application number 10-2007-0046132 filed on May 11, 2007, which is incorporated herein by reference in its entirety.

BACKGROUND OF THE INVENTION

The present invention relates to a phase change memory device, and more particularly, to a phase change memory device using a pnp-BJT which prevents the composition of a phase change layer from being changed and widens the sensing margin of a bit line.

In general, memory devices are largely divided into a volatile RAM (random access memory), which loses inputted information when power is interrupted, and a non-volatile ROM (read-only memory), which can continuously maintain the stored state of inputted information even when power is interrupted. Examples of volatile RAM include, DRAM (dynamic RAM) and SRAM (static RAM), and an example of non-volatile ROM is flash memory such as an EEPROM (electrically erasable and programmable ROM).

DRAM is well known in the art as an excellent memory device; however, the DRAM must have high charge storing capacity requiring the surface area of an electrode to be increased, causing difficulties to accomplish a high level of integration. Further, in flash memory two gates are stacked on each other, and therefore the required operation voltage is high compared to the source voltage. As a result, a separate booster circuit is needed to form the voltage necessary for write and delete operations making it difficult to accomplish a high level of integration.

In order to solve the above problem, efforts in research have been directed towards developing a novel memory device with a simple configuration that is capable of a high level of integration while still retaining the characteristics of a non-volatile memory device. As a result of these efforts, a phase change memory device has recently been disclosed in the art.

In the phase change memory device a phase change occurs in a phase change layer interposed between a lower electrode and an upper electrode. The phase change is from a crystalline state to an amorphous state, and the phase change is due to the flow of current between the lower electrode and the upper electrode. The information stored in a cell is recognized by comparing the resistance of the present state to the medium of the difference between the resistance of the crystalline state and the resistance of the amorphous state.

In the phase change memory device, a CMOS transistor or a PNP-bipolar junction transistor (hereinafter, referred to as a "pnp-BJT") can be used as a switching element. A phase change memory device with a pnp-BJT has a smaller cell size compared to a phase change memory device with a CMOS transistor. Additionally, since the pnp-BJT has excellent current driving capability, the pnp-BJT can realize a phase change memory device with a high programming current.

A phase change memory device using the pnp-BJT as a switching element has been disclosed in a paper entitled "A 90 nm Phase Change Memory Technology for Stand-Alone Non-Volatile Memory Application" at VLSI 2006.

The phase change memory device adopts a vertical pnp-BJT. In the phase change memory device an emitter region, a base region and a collector region are formed using an ion implantation process. The phase change memory device is formed with a phase change layer and an upper electrode on the emitter region, a bit line that comes into contact with the upper electrode, and a word line that comes into contact with the base region.

However, in the above conventional phase change memory device (which adopts the pnp-BJT as a switching element), since the bit line comes into direct contact with the upper electrode, the upper electrode must be formed so that the upper electrode is thick. When etching an upper electrode material and a phase change material, the etching time is extended due to the increased thickness of the upper electrode. As a result, etch loss is caused in the edge portions of the phase change layer. Due to the etch loss, the composition of the phase change layer will likely change. Accordingly, in the above conventional phase change memory device (with the pnp-BJT), the characteristics of the phase change memory device can be degraded due to the change of the composition of the phase change layer.

Further, in the above conventional phase change memory device (with the pnp-BJT), TiN is the material used as the upper electrode. A TiN upper electrode serves as a factor increasing the resistance of the upper electrode, which has the shape of a bar. Therefore, in the conventional phase change memory device (with the pnp-BJT), since the bar-shaped upper electrode has a high resistance, the sensing margin of the bit line is likely to be degraded.

SUMMARY OF THE INVENTION

Embodiments of the present invention are directed to a phase change memory device that prevents the composition of a phase change layer from changing.

Additionally, embodiments of the present invention are directed to a phase change memory device that widens the sensing margin of a bit line.

In one aspect, a phase change memory device comprises a semiconductor substrate having a plurality of bar-shaped active regions which extend in a first direction and are spaced apart in a second direction perpendicular to the first direction; the active regions are arranged such that each active region in a pair of active regions is spaced apart from one another by a first interval, a pair of active regions is spaced apart from another pair of active regions by a second interval with the four active regions constituting one block, and a plurality of blocks are spaced apart from one another by a third interval; base regions and emitter regions alternately formed in each active region and which are formed along the first direction and are spaced apart from each other; lower electrodes formed over the emitter regions to connect to the respective emitter regions; a phase change layer and upper electrodes stacked on each of the lower electrodes; a plurality of spaced apart sub bit lines formed extending in a second direction over the upper electrodes to come into contact with the upper electrodes; word lines extending in the second direction over the sub bit lines to come into contact with the base regions which are arranged along the first direction; and a main bit line extending in the second direction over the word lines to come into contact with the sub bit lines along the second direction.

The base region comprises an N-type impurity region, and the emitter region comprises a P-type impurity region.

The base region may be formed deeper than the emitter region.

The phase change memory device can further comprise metal suicides formed on surfaces of the base regions and the emitter regions.

The phase change memory device can further comprise first contact plugs that are both formed on the base regions to connect to the word line and also are interposed between the emitter regions and the lower electrodes.

The lower electrodes formed on the first contact plugs may have the shape of a plug.

The phase change memory device can further comprise conductive patterns interposed between each of the first contact plugs and the corresponding lower electrode.

The phase change layer and the upper electrode can have a rectangular or square shape.

The phase change memory device may further comprise second contact plugs interposed between each of the upper electrodes and the corresponding sub bit line.

The sub bit lines are formed of a material that has lower resistance than the upper electrodes.

Each of the sub bit lines, which come into contact with the main bit line, is formed to come into contact with four upper electrodes arranged in each block.

Each of the sub bit lines, which come into contact with the main bit line, is formed to come into contact with two upper electrodes arranged in two respective active regions that are spaced apart from each other by the first interval.

The phase change memory device further comprises third contact plugs interposed between each of the first contact plugs on the base regions and the corresponding word line.

The third contact plugs have a smaller size than the first contact plugs.

The word line has a width that is equal to or less than that of the bar-shaped active region.

The phase change memory device may further comprise fourth contact plugs interposed between the sub bit lines and the main bit line, the fourth contact plug is formed to be placed in the second interval between the active regions, and at this time, the second interval is greater than the first interval.

The phase change memory device may further comprise fourth contact plugs interposed between the sub bit lines and the main bit line, the fourth contact plug is formed to be placed in the first interval between the active regions, and at this time, the first interval is greater than the second interval.

DESCRIPTION OF SPECIFIC EMBODIMENTS

In the present invention, a phase change memory device is realized with a sub bit line formed on a stack pattern of a phase change layer, an upper electrode using a material with a lower resistance than the material of the upper electrode, and a main bit line formed over the sub bit line and coming into contact with the sub bit line.

Therefore, in the present invention, because the sub bit line is formed on the stack pattern of the phase change layer and because the upper electrode is a material with a lower resistance than the upper electrode, the sensing margin of the main bit line can be widened.

Also, in the present invention, the upper electrode can be formed with a decreased thickness due to the formation of the sub bit line. Therefore, the etching time of the upper electrode and the phase change layer can be shortened, and thus the etch loss of the phase change layer can be avoided. As a result, in the present invention, the etch loss and resultant change of the composition of the phase change layer can be prevented and the variation of the programming current of the phase change memory device can be reduced. As such, the characteristics of the phase change memory device can be improved.

Hereafter, phase change memory devices according to specific embodiments of the present invention will be described in detail with reference to the attached drawings.

Figure 1A:
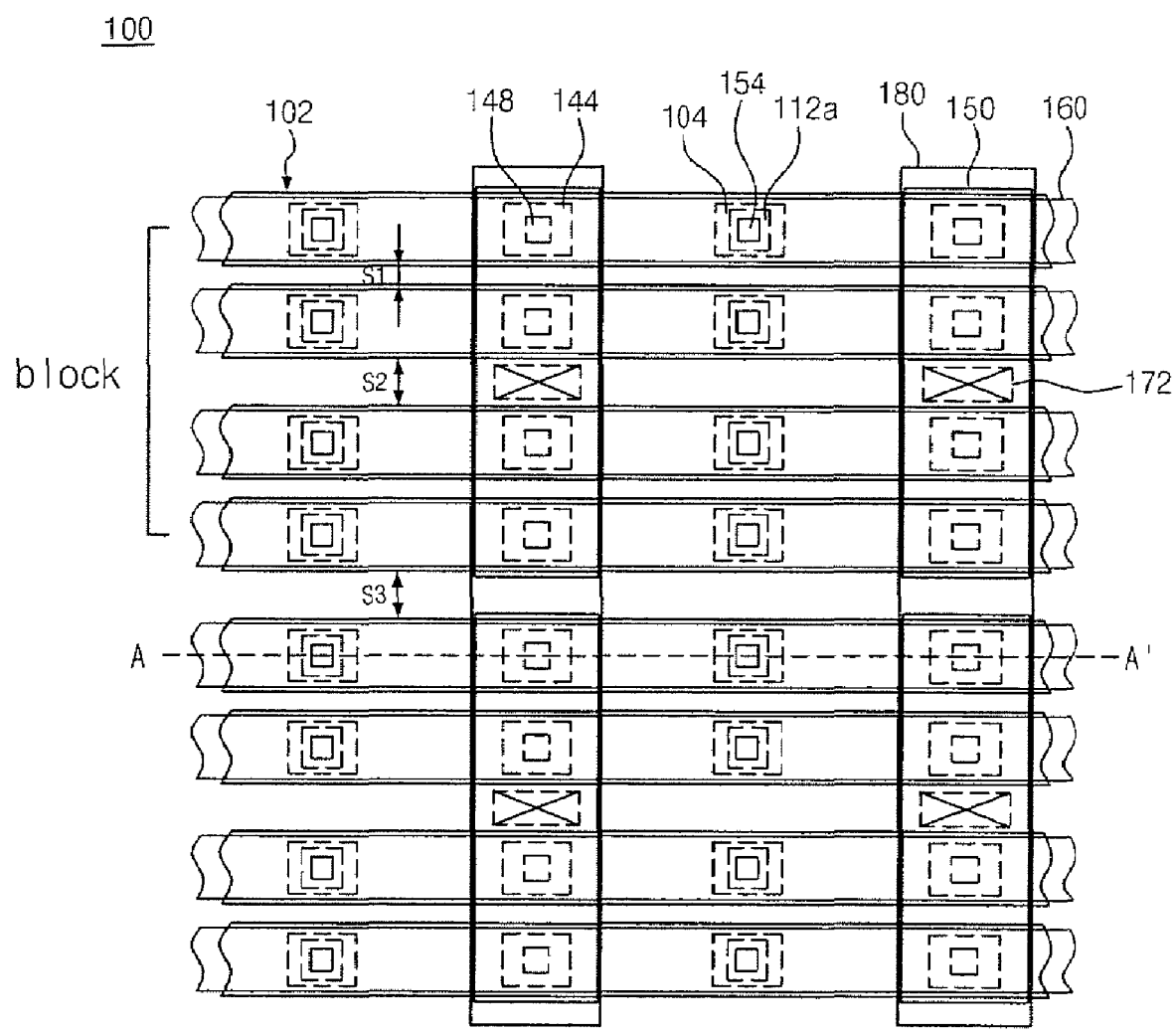
FIG. 1A is a plan view illustrating a phase change memory device in accordance with one embodiment of the present invention.
Figure 1B:
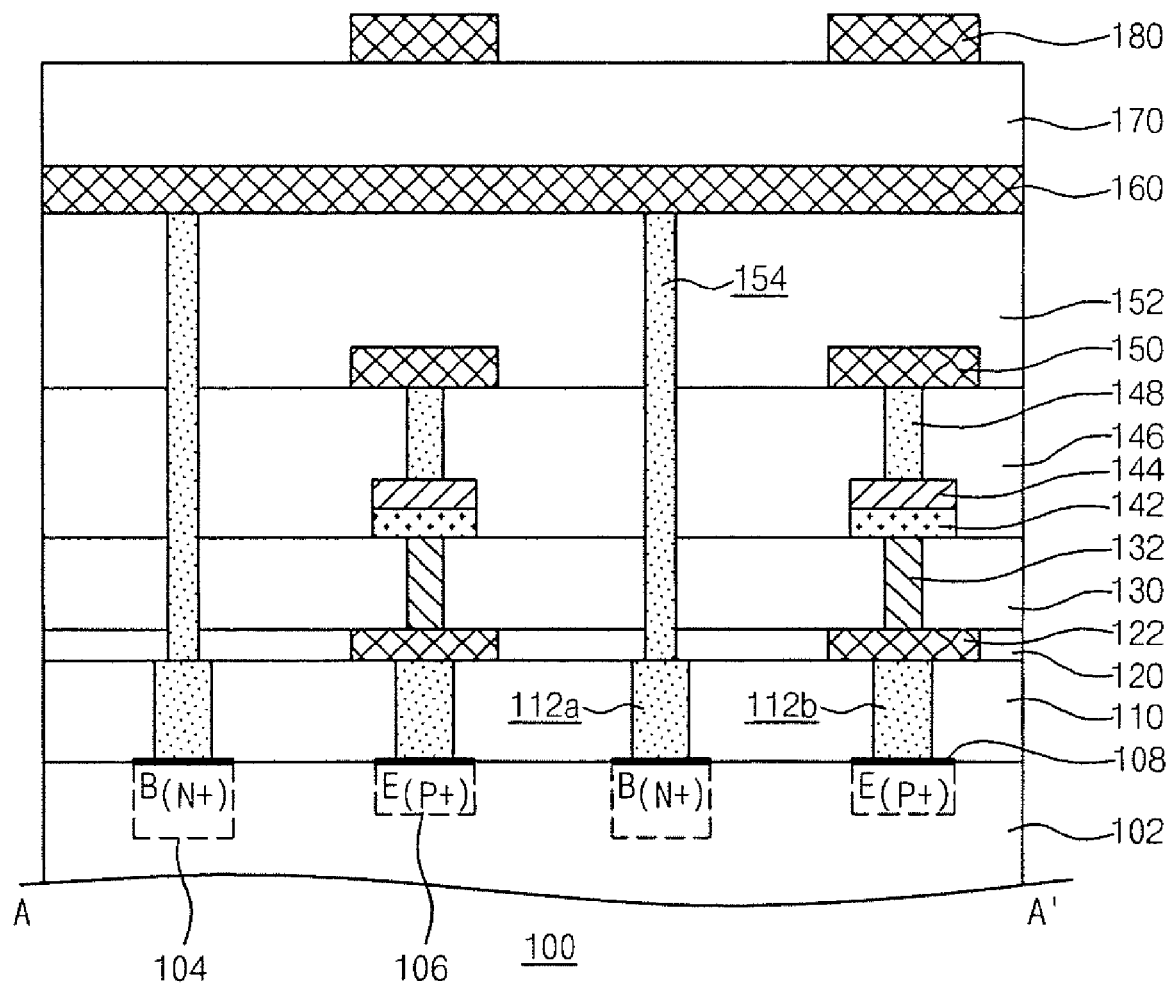
FIG. 1B is a cross-sectional view taken along the line A-A' of FIG. 1A.

FIG. 1A is a plan view illustrating a phase change memory device in accordance with one embodiment of the present invention, and FIG. 1B is a cross-sectional view taken along the line A-A' of FIG. 1A.

Referring to FIGS. 1A and 1B, the phase change memory device in accordance with the present embodiment includes a semiconductor substrate 100 having a plurality of bar-shaped active regions 102 that extend in a first direction and are spaced apart in a second direction perpendicular to the first direction. The active regions 102 are arranged in a manner such that the active regions 102 in a pair of active regions 102 are spaced apart from one another by a first interval S1 and a pair of active regions 102 are spaced apart from another pair of active regions by a second interval S2. The second interval S2 is greater than the first interval S1 and four active regions 102 constitute one block. Each of these blocks (having the four active regions 102) is spaced apart from one another by a third interval S3.

Base regions 104 and emitter regions 106 are formed in each bar-shaped active region 102. The base regions and emitter regions are formed at a distance from each other and alternate along the active region. The base and emitter regions are formed using an ion implantation process. The base region 104 is composed of an N-type impurity region and the emitter region 106 is composed of a P-type impurity region. The base region 104 is formed deeper than the emitter region 106. The semiconductor substrate 100 (having the active regions 102) is a P-type substrate and serves as a collector. Accordingly, a pnp-BJT including the emitter region 106, the base region 104 and the collector region is constructed as a switching element.

Metal silicides 108 are formed on the base regions 104 and the emitter regions 106. First contact plugs 112a and 112b are formed on the metal silicides of the base region 104 and the emitter region 106. A conductive pattern 122 made of a metal is formed on the first contact plug 112b of the emitter region 106, and a lower electrode 132 is formed on the conductive pattern 122 in the shape of a plug. A phase change layer 142 and an upper electrode 144 are stacked on the plug-shaped lower electrode 132. The conductive pattern 122 may be omitted.

A second contact plug 148 is formed to come into contact with the upper electrode 144. A sub bit line 150 is formed in the direction perpendicular to the active regions 102 (second direction), and comes into contact with the second contact plugs 148 provided in the active regions 102 of each block. In other words, the sub bit line 150 is formed to come into contact with the upper electrodes 144 in each block via the second contact plugs 148. A third contact plug 154 is comes into contact with the first contact plugs 112a that are formed on the base regions 104. The third contact plug 154 is formed to have a smaller size than the first contact plug 112a.

A word line 160 is formed over the sub bit line 150 to come into contact with the third contact plugs 154. The word line 160 is formed with a width that is equal to or less than the width of the active region 102. A fourth contact plug 172 is formed on a portion of the sub bit line 150 that is placed in the second interval S2. Main bit lines 180 are formed in the direction perpendicular to the active regions 102 (the second direction). The main bit lines 280 come into contact with the fourth contact plugs 172 (which are in contact with the respective sub bit lines 150).

In the phase change memory device according to the present embodiment, the sub bit line 150 is formed of a material having a resistance lower than that of the upper electrode 144. As a result, the sensing margin of the main bit line 160 can be widened. Also, by forming the sub bit line 150 it is possible to decrease the thickness of the upper electrode 144. When the upper electrode's thickness is decreased, the etching time of the upper electrode and phase change layer can be decreased. With a reduced etch time, the etch loss and resultant change of the composition of the phase change layer can be prevented, and variation of the programming current of the phase change memory device can be reduced. As such, the characteristics of the phase change memory device can be improved.

FIGS. 2A through 2G are plan views illustrating the processes of a method for manufacturing the phase change memory device in accordance with one embodiment of the present invention, and FIGS. 3A through 3G are cross-sectional views taken along the lines A-A' of FIGS. 2A through 2G.

Figure 2A:
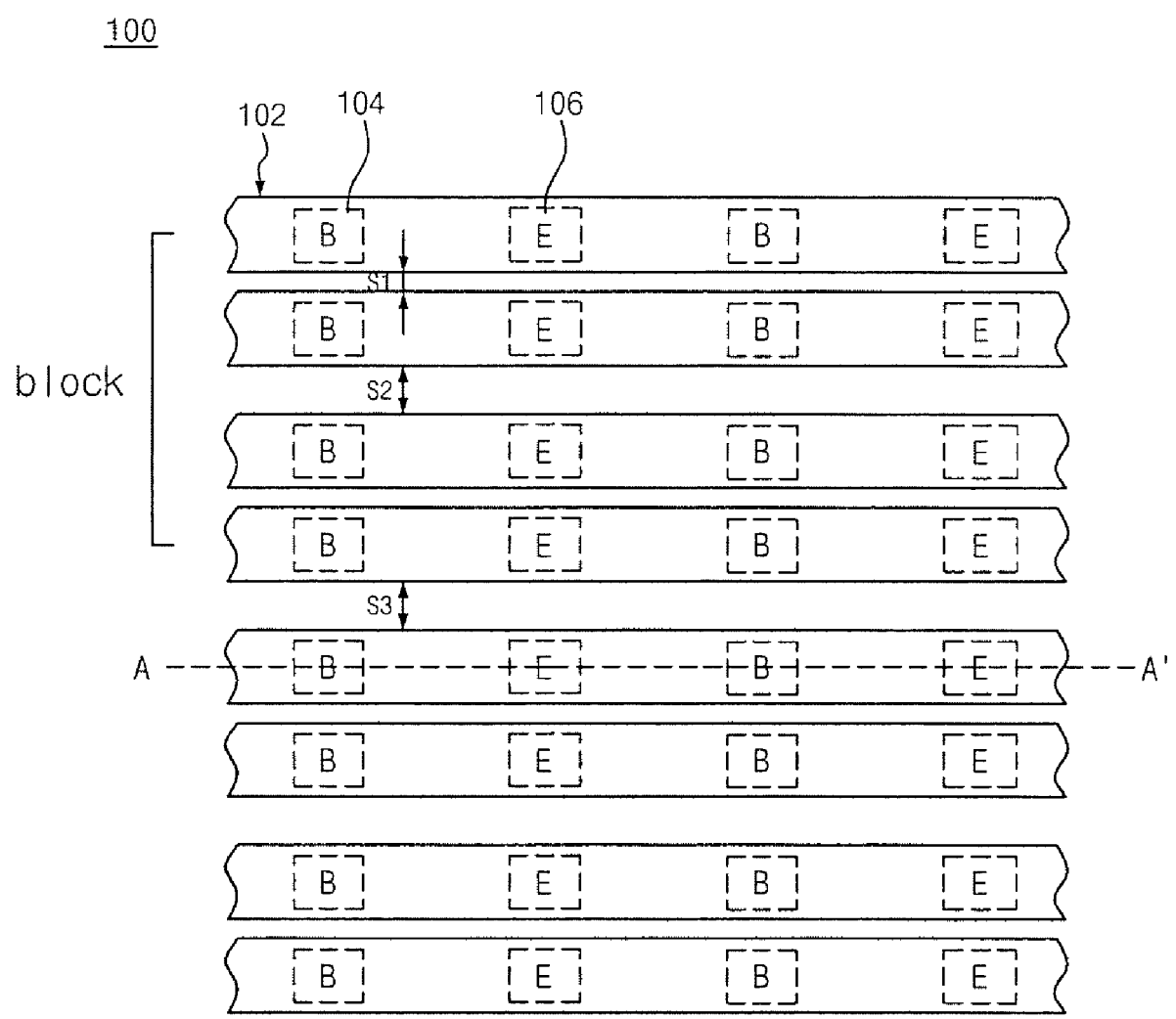
FIGS. 2A through 2G are plan views illustrating the processes of a method for manufacturing the phase change memory device in accordance with one embodiment of the present invention.
Figure 3A:
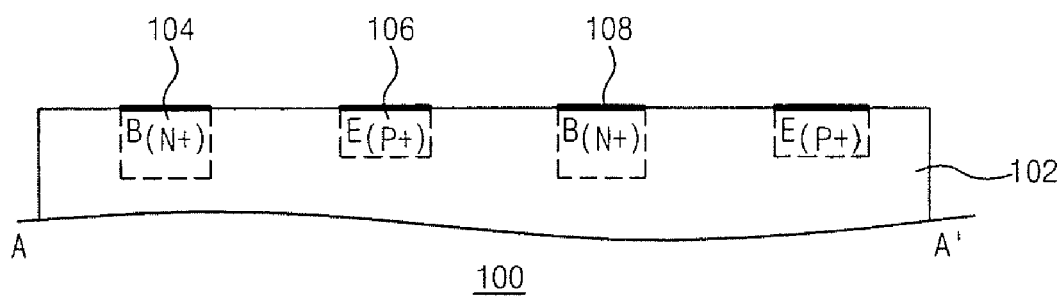
FIGS. 3A through 3G are cross-sectional views taken along the lines A-A' of FIGS. 2A through 2G.

Referring to FIGS. 2A and 3A, a semiconductor substrate 100 with a plurality of bar-shaped active regions 102 that extend in a first direction and that are spaced apart in a second direction perpendicular to the first direction is prepared. The active regions 102 are arranged in a manner such that the active regions 102 in a pair of active regions 102 are spaced apart from one another by a first interval S1. a pair of active regions 102 is spaced apart from another pair of active regions 102 by a second interval S2. The second interval S2 is greater than the first interval S1, and the four active regions 102 constitute one block. Each of these blocks are spaced apart from one another by a third interval S3 that is different than the first interval St and the second interval S2. The portion of the semiconductor substrate 100 between the active regions 102 spaced apart by the second interval S2 serves as a region where a sub bit line and a main bit line come into contact with each other. In order to secure a contact margin between the sub bit line and the main bit line, the second interval S2 is set to be greater than the first interval S1.

By conducting an ion implantation process on the semiconductor substrate 100 with the bar-shaped active regions 102, base regions 104 and emitter regions 106 are formed. These base and emitter regions 104 and 106 are formed on each bar-shaped active region 102. The base regions 104 will subsequently come into contact with a word line, and the emitter regions 106 will subsequently come into contact with a phase change layer. The base region 104 is formed as an N-type impurity region, and the emitter region 106 is formed as a P-type impurity region. The base regions 104 and the emitter regions 106 are spaced apart from each other and alternate along the direction of the active regions 102 (the first direction). The base region 104 is formed deeper than the emitter region 106. Metal suicides 108 are formed on the base regions 104 and the emitter regions 106 to reduce the contact resistance between the base and emitter regions 104 and 106 and the subsequently formed first contact plugs.

Figure 2B:
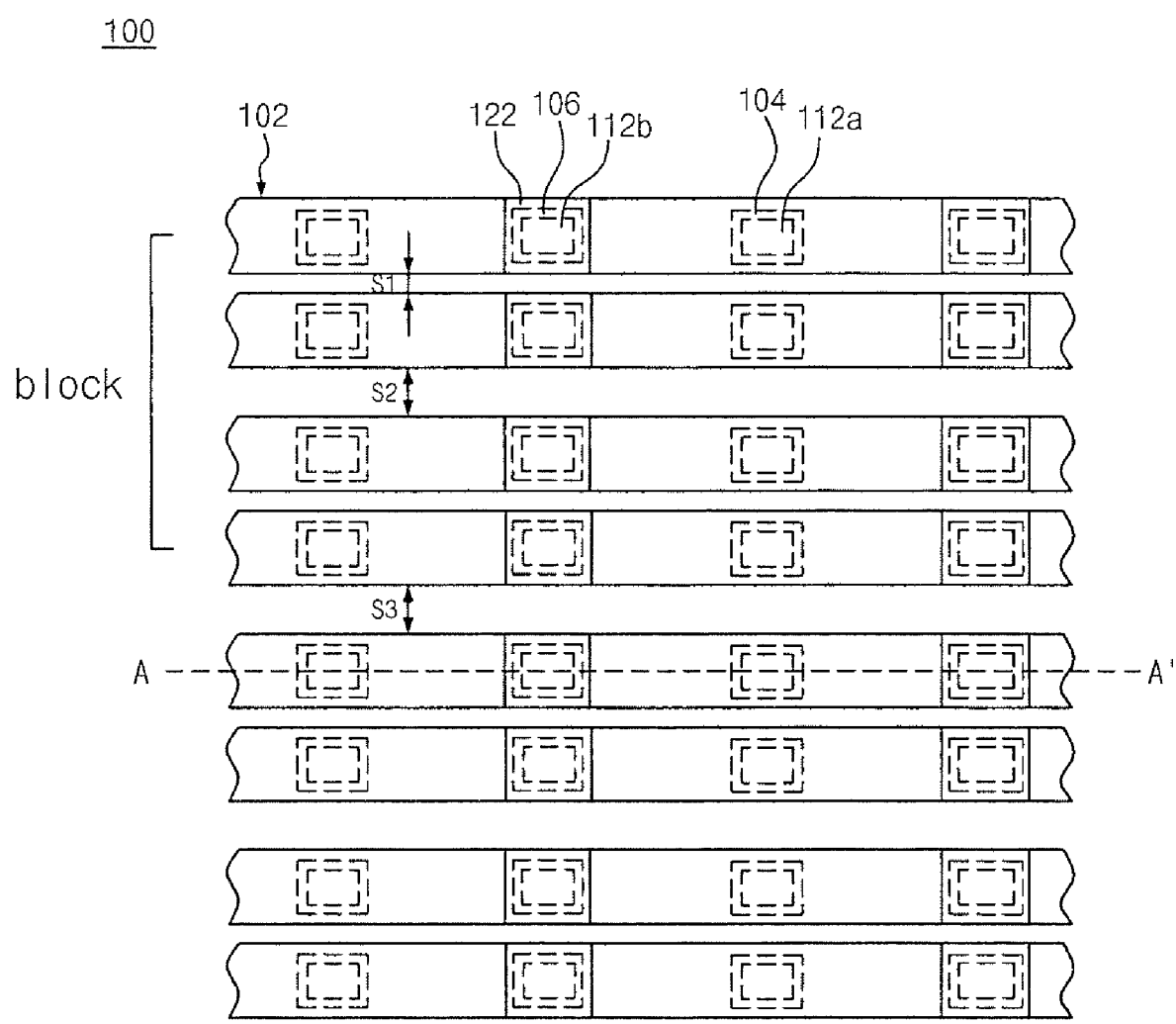
Figure 3B:
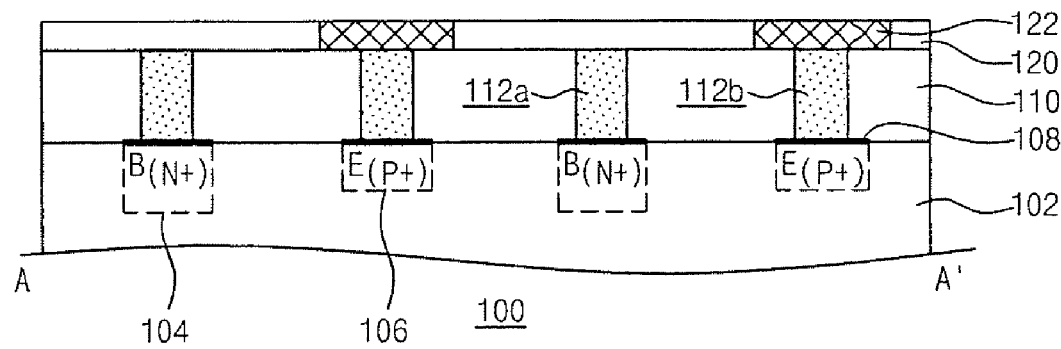

Referring to FIGS. 2B and 3B, after forming a first interlayer dielectric 110 on the semiconductor substrate 100 (which is formed with the base regions 104 and the emitter regions 106 and metal suicides 108), by etching the first interlayer dielectric 110, first contact holes are defined to expose the base regions 104 and the emitter regions 106. By filling a conductive material in the first contact holes, first contact plugs 112a and 112b are formed. After forming a first insulation layer 120 on the first interlayer dielectric 110 and the first contact plugs 112a and 112b, conductive patterns 122 are formed in the first insulation layer 120 using the well-known damascene process. The conductive patterns 122 come into contact with the first contact plugs 112b on the emitter regions 106. The conductive patterns 122 may be formed into a rectangular or square shape. The conductive pattern 122 may also be omitted.

Figure 2C:
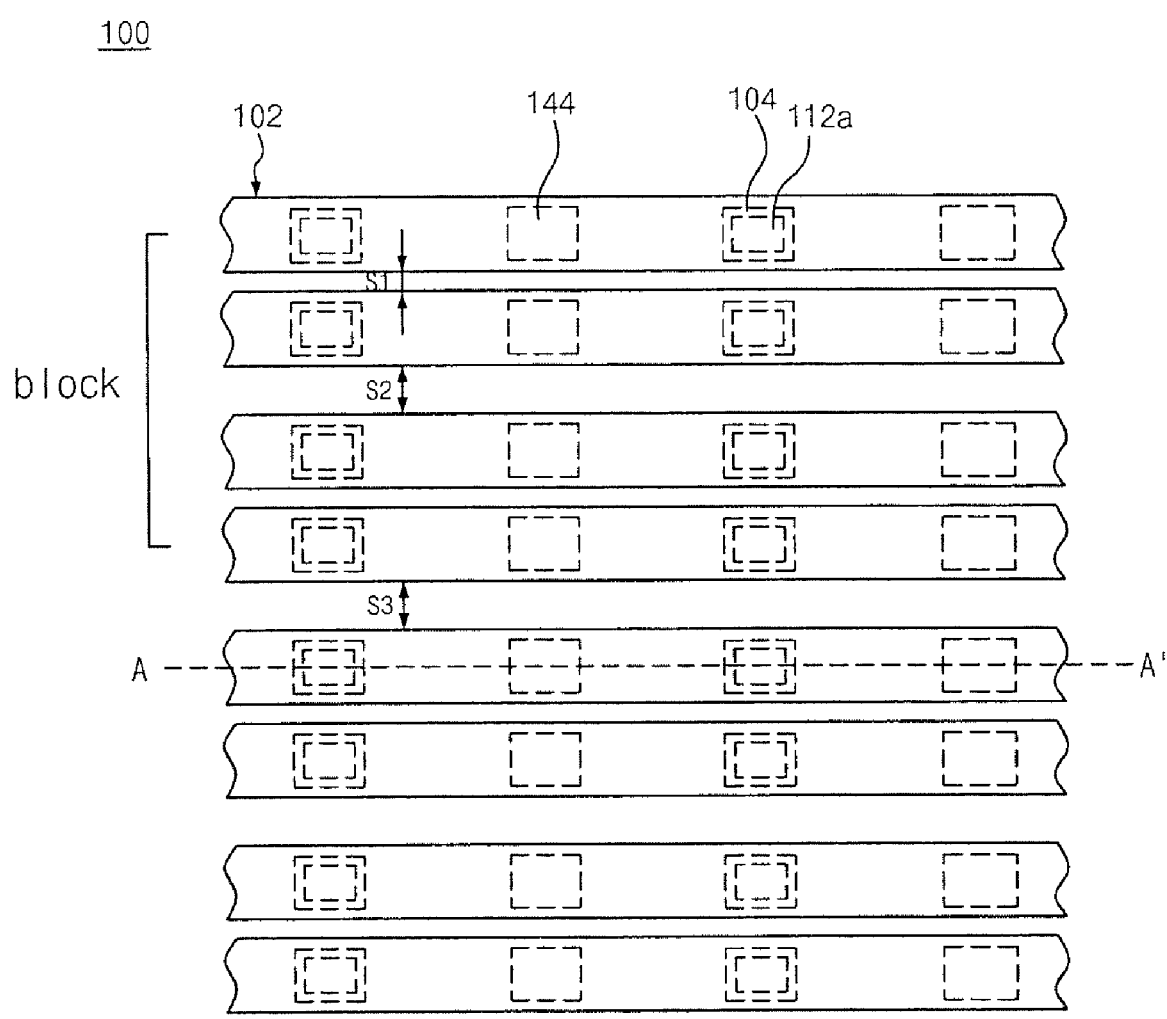
Figure 3C:
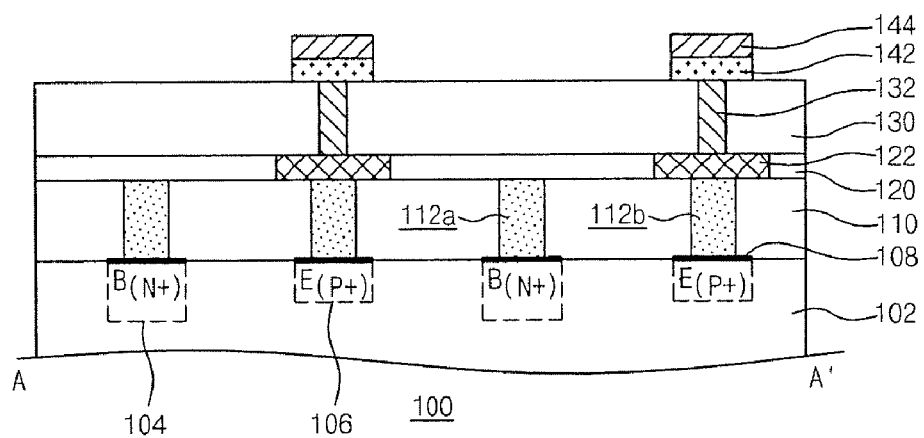

Referring to FIGS. 2C and 3C, a second insulation layer 130 is formed on the first insulation layer 120 and the conductive patterns 122. The second insulation layer 130 is then etched to define holes for lower electrodes. The holes for the lower electrodes expose the conductive patterns 122. By filling a conductive material in the holes, lower electrodes 132 are formed. A phase change material and an upper electrode material are sequentially formed on the second insulation layer 130 and the lower electrodes 132. The upper electrode material and the phase change material are etched, and a stack pattern of a phase change layer 142 and an upper electrode 144 is formed on each lower electrode 132 and a portion of the second insulation layer 130 surrounding the lower electrode 132. In the present invention, the upper electrode material is deposited at a reduced thickness compared to the conventional art. Thus, the etching time of the upper electrode material and the phase change material can be reduced. Therefore, it is possible to maximally suppress etch loss in the edge portions of the phase change layer 142. By suppressing this etch loss, it is possible to prevent the composition of the phase change layer 142 from being changed.

Figure 2D:
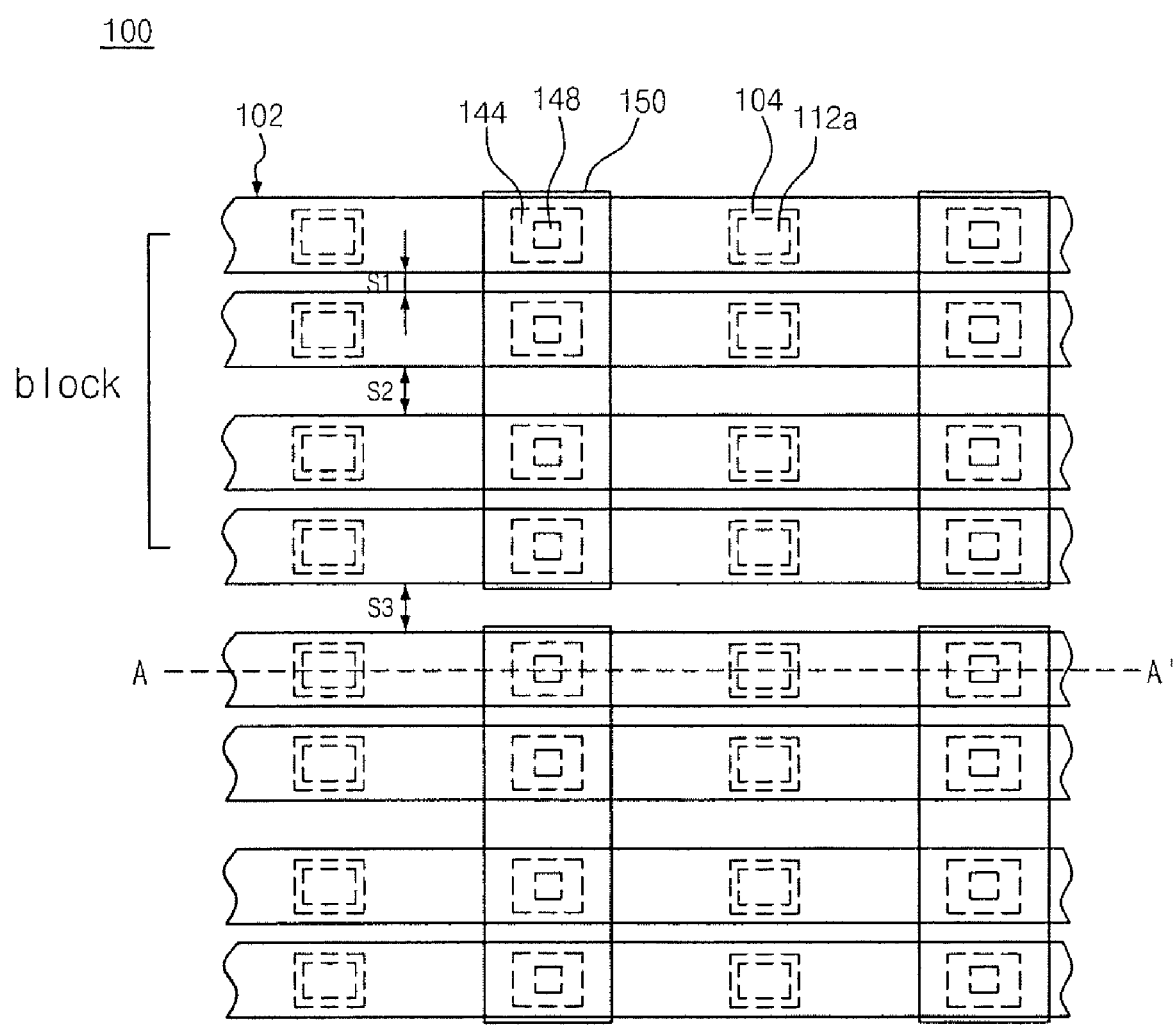
Figure 3D:
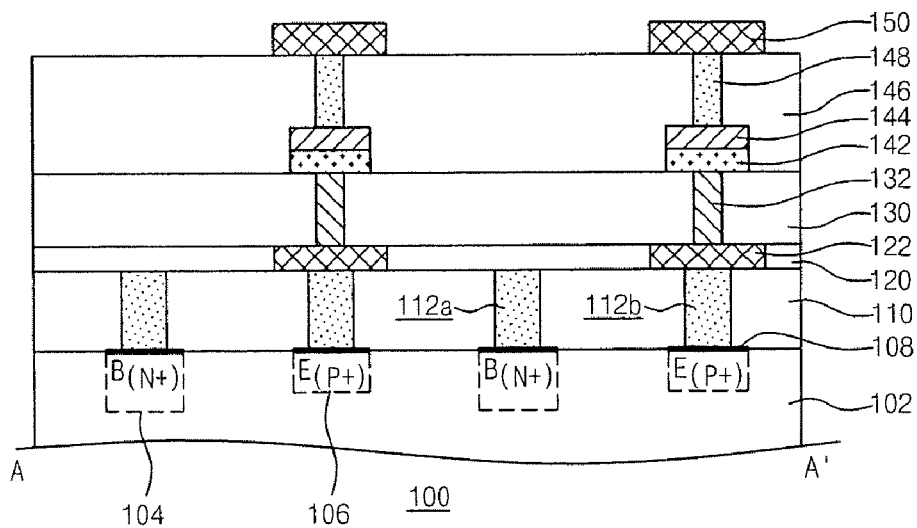

Referring to FIGS. 2D and 3D, a second interlayer dielectric 146 is formed on the second insulation layer 130. The second insulation layer 130 covers the phase change layer 142 and the upper electrode 144. The second interlayer dielectric 146 is etched to define second contact holes that expose the upper electrodes 144. A conductive material is filled in the second contact holes to form second contact plugs 148. A conductive layer is deposited on the second interlayer dielectric 146 and the second contact plugs 148. The conductive layer is then etched to form sub bit lines 150 the direction perpendicular to the active regions 102 (the second direction). The sub bit lines 150 come into contact with the second contact plugs 148, which are provided on the upper electrodes 144 located in each block. The sub bit line 150 is formed with a material having a resistance lower than that of the upper electrode material, and to have a width greater or less than that of the stack pattern having the phase change layer 142 and the upper electrode 144.

In the present invention, by forming the sub bit line 150 with a material having a resistance lower than that of the upper electrode 144, the sensing margin of a main bit line, which is subsequently formed to come into contact with the sub bit line 150, can be widened. Also, in the present invention when forming the sub bit line 150, the upper electrode 144 can be formed to have a decreased thickness compared to the conventional art. Additionally, the etching time of the upper electrode material and the phase change material can be shortened. As a result, the etch loss of the phase change layer 142 can be prevented, and the variation of the programming current of the phase change memory device can be reduced. Hence, the characteristics of the phase change memory device can be improved.

Figure 2E:
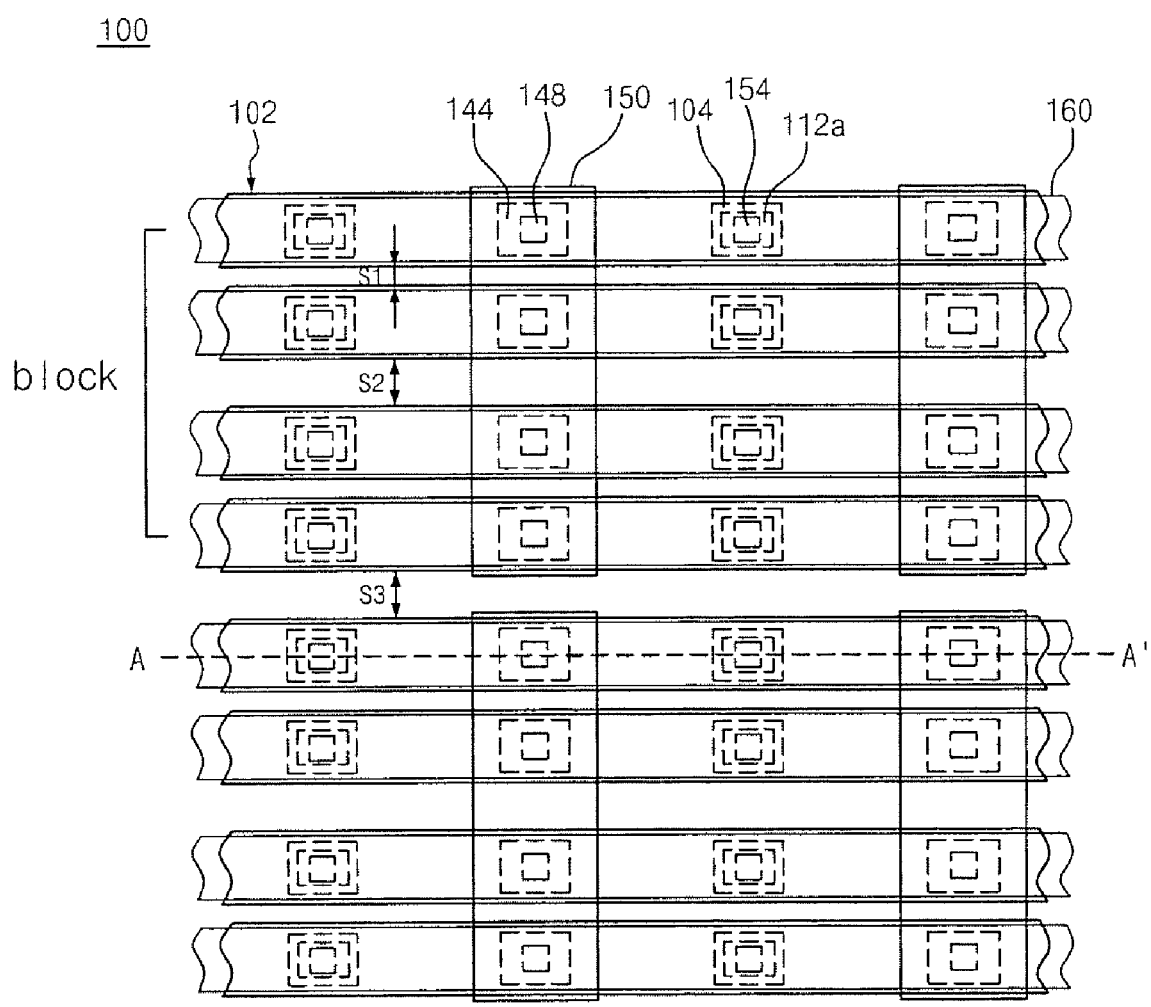
Figure 3E:
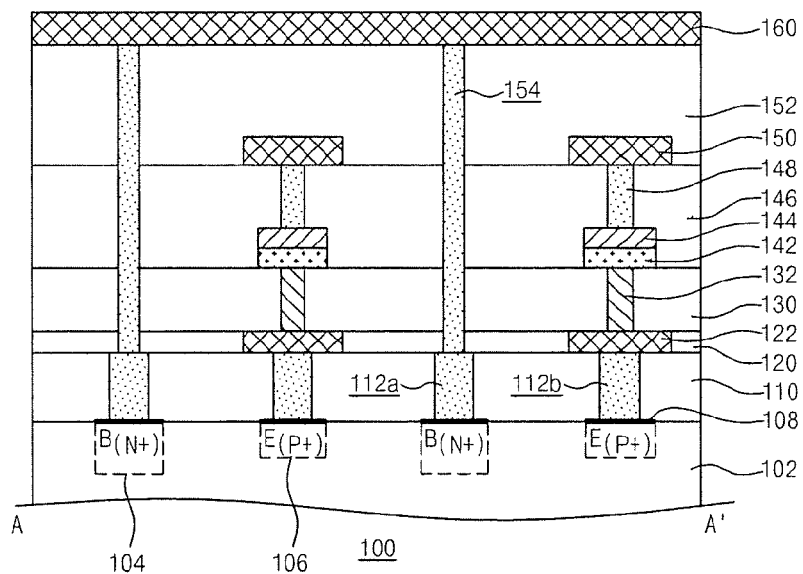

Referring to FIGS. 2E and 3E, a third interlayer dielectric 152 is formed on the second interlayer dielectric 146 and the sub bit lines 150. The third interlayer dielectric 152, the second interlayer dielectric 146, the second insulation layer 130 and the first insulation layer 120 are etched to define third contact holes that expose the first contact plugs 112a (which are formed on the base regions 104). A conductive material is filled in the third contact holes to form contact plugs 154. The contact plugs 154 come into contact with the first contact plugs 112a (which are formed on the base regions 104). The third contact plugs 154 are formed to have a smaller size than the first contact plugs 112a on the base regions 104. A conductive layer is formed on the third interlayer dielectric 152 and the third contact plugs 154. The conductive layer is then etched to form a word line 160 on the active region 102. The word line comes into contact with the third contact plugs 154, and the word lines are arranged the direction of the active region 102 (first direction).

Figure 2F:
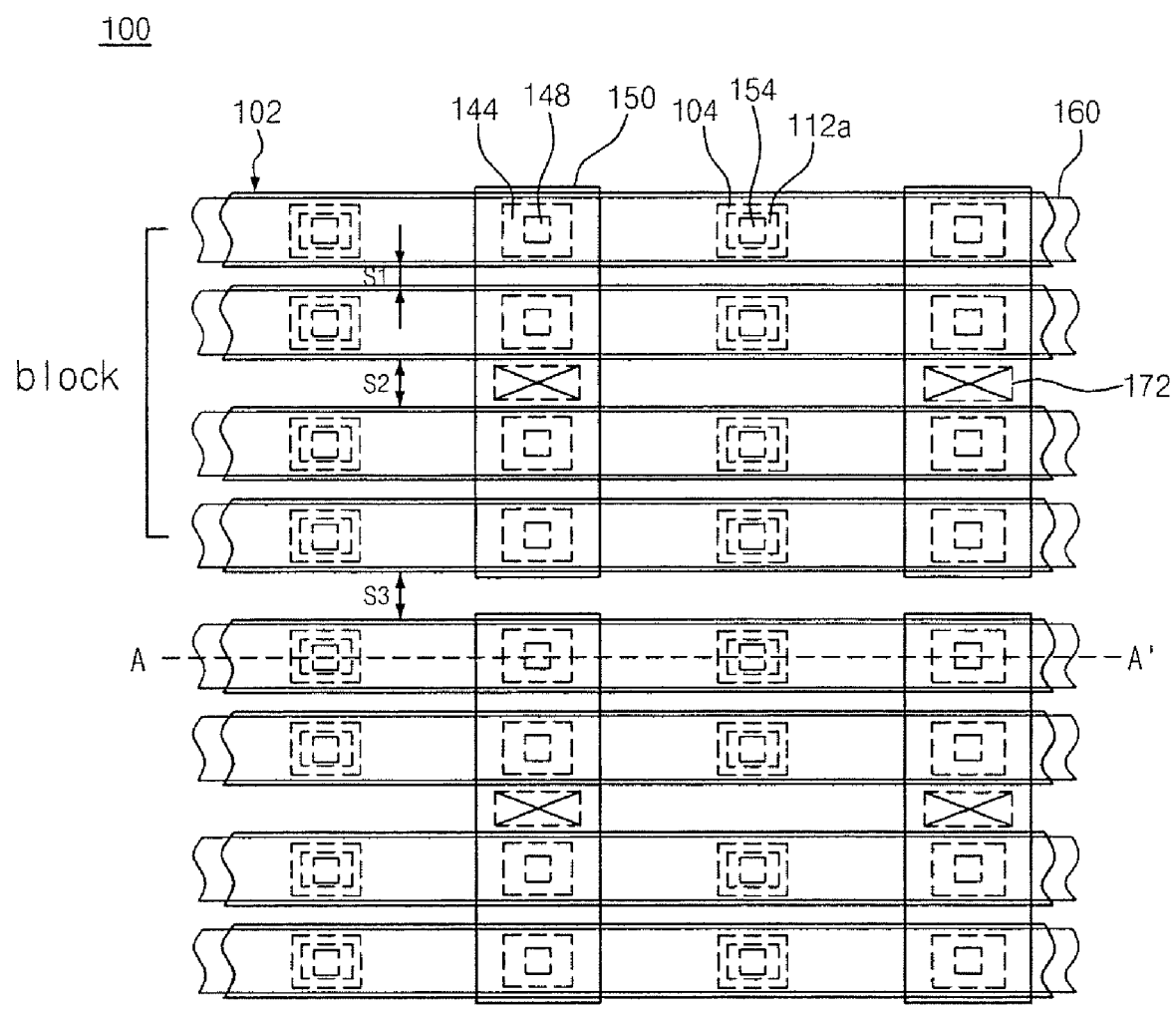
Figure 3F:
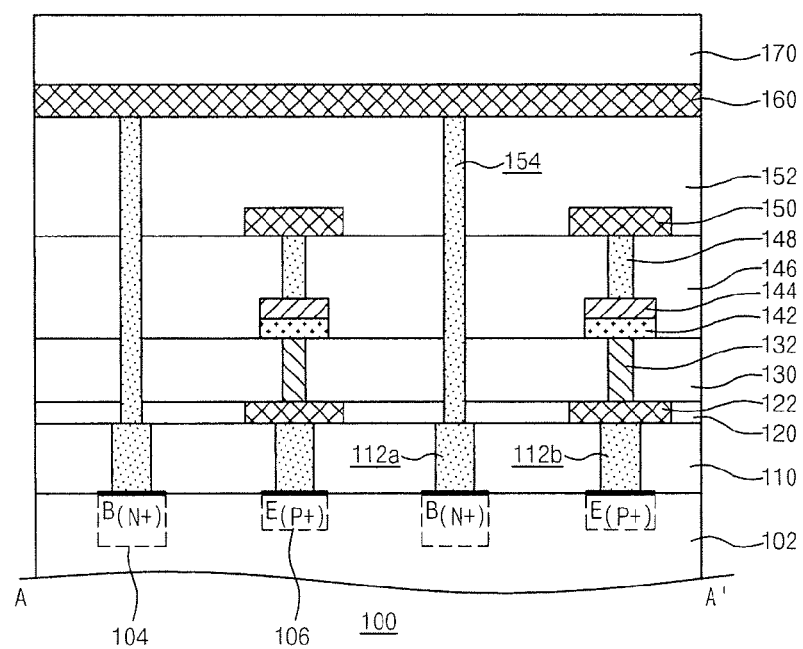

Referring to FIGS. 2F and 3F, a fourth interlayer dielectric 170 is formed on the third interlayer dielectric 152 and the word line 160. The fourth interlayer dielectric 170 and the third interlayer dielectric 152 are etched to define fourth contact holes which expose the sub bit lines 150. A conductive material is filled in the fourth contact holes to form fourth contact plugs 172. The contact plugs 172 come into contact with the sub bit lines 150. Each fourth contact plug 172 is formed to come into contact with the portion of the sub bit line 150 that is located in the second interval S2 that is located between the active regions 102. For this reason, the second interval S2 is set to be greater than the first interval S1.

Figure 2G:
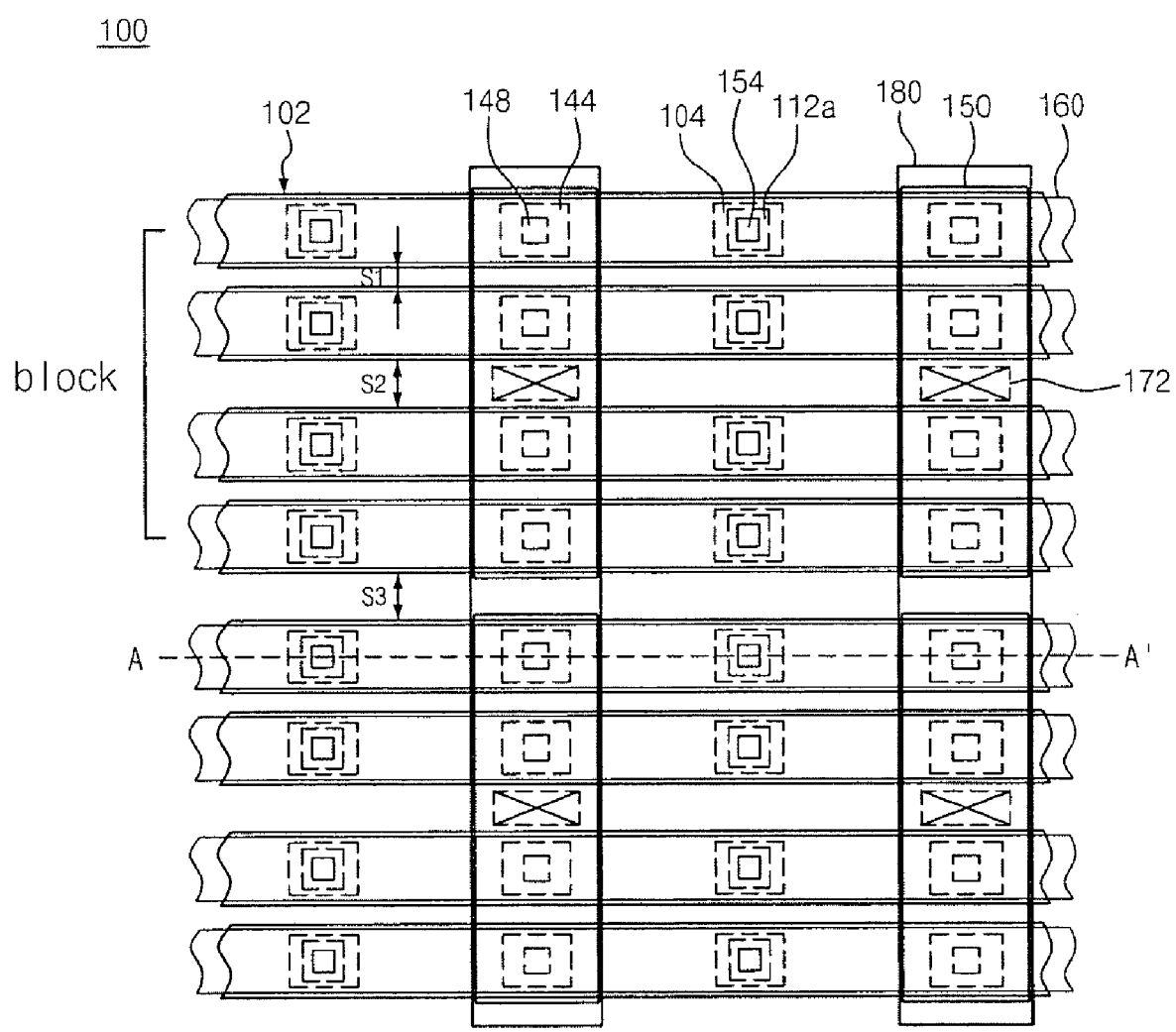
Figure 3G:
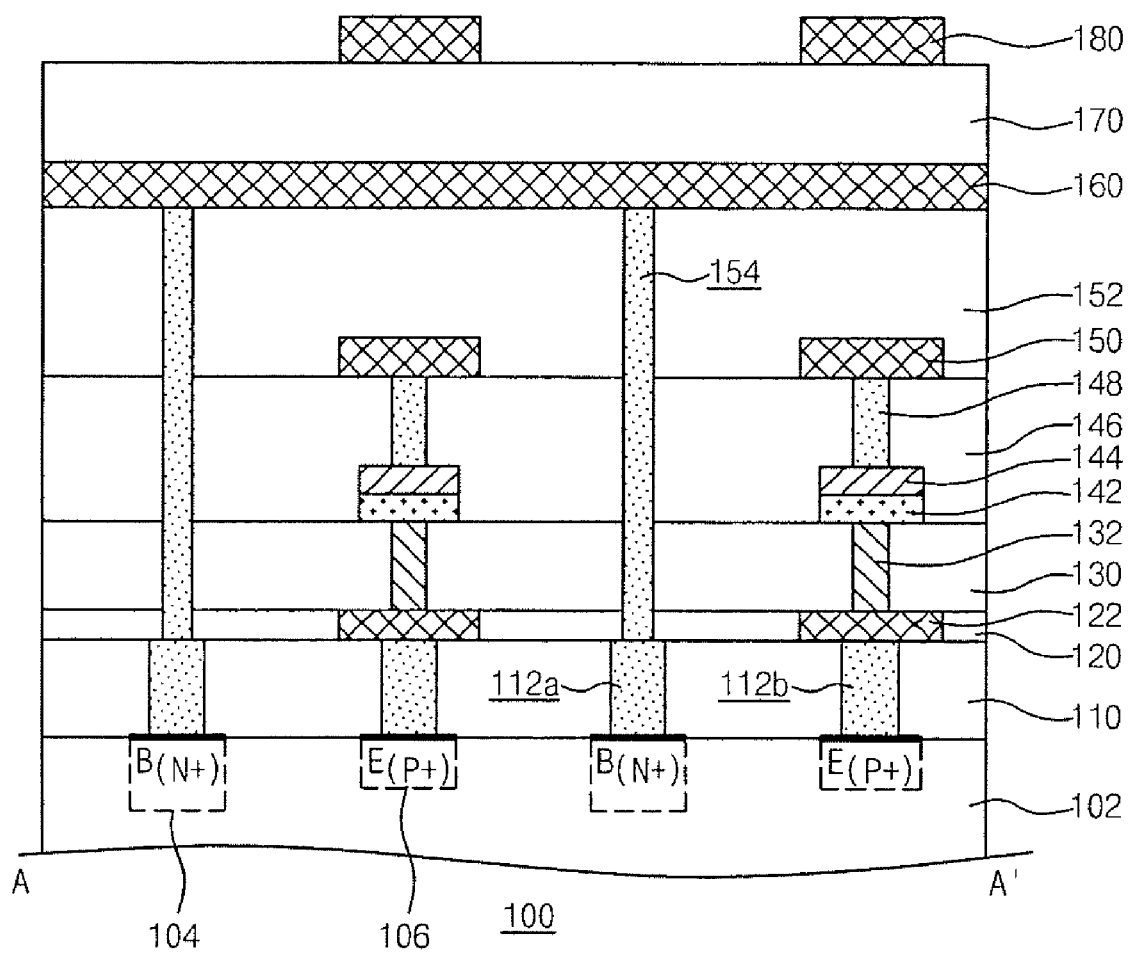

Referring to FIGS. 2G and 3G, A conductive layer is deposited on the fourth interlayer dielectric 170 and the fourth contact plugs 172. The conductive layer is then patterned to form a main bit line 180 that comes into contact with the fourth contact plugs 172 (which are formed to come into contact with the respective sub bit lines 150 in the direction perpendicular to the active regions 102).

Thereafter, while not shown in the drawings, a series of subsequent well-known processes are sequentially conducted, and the manufacture of the phase change memory device in accordance with the present embodiment of the present invention is completed.

As is apparent from the above description, in the phase change memory device according to the present embodiment a sub bit line is formed of a material having low resistance, thus widening the sensing margin of the main bit line. Additionally, the present invention allows the thickness of an upper electrode to be decreased, resulting in the prevention of etch loss and the resultant change in the composition of a phase change layer. Hence, the characteristics of the phase change memory device can be improved.

Figure 4:
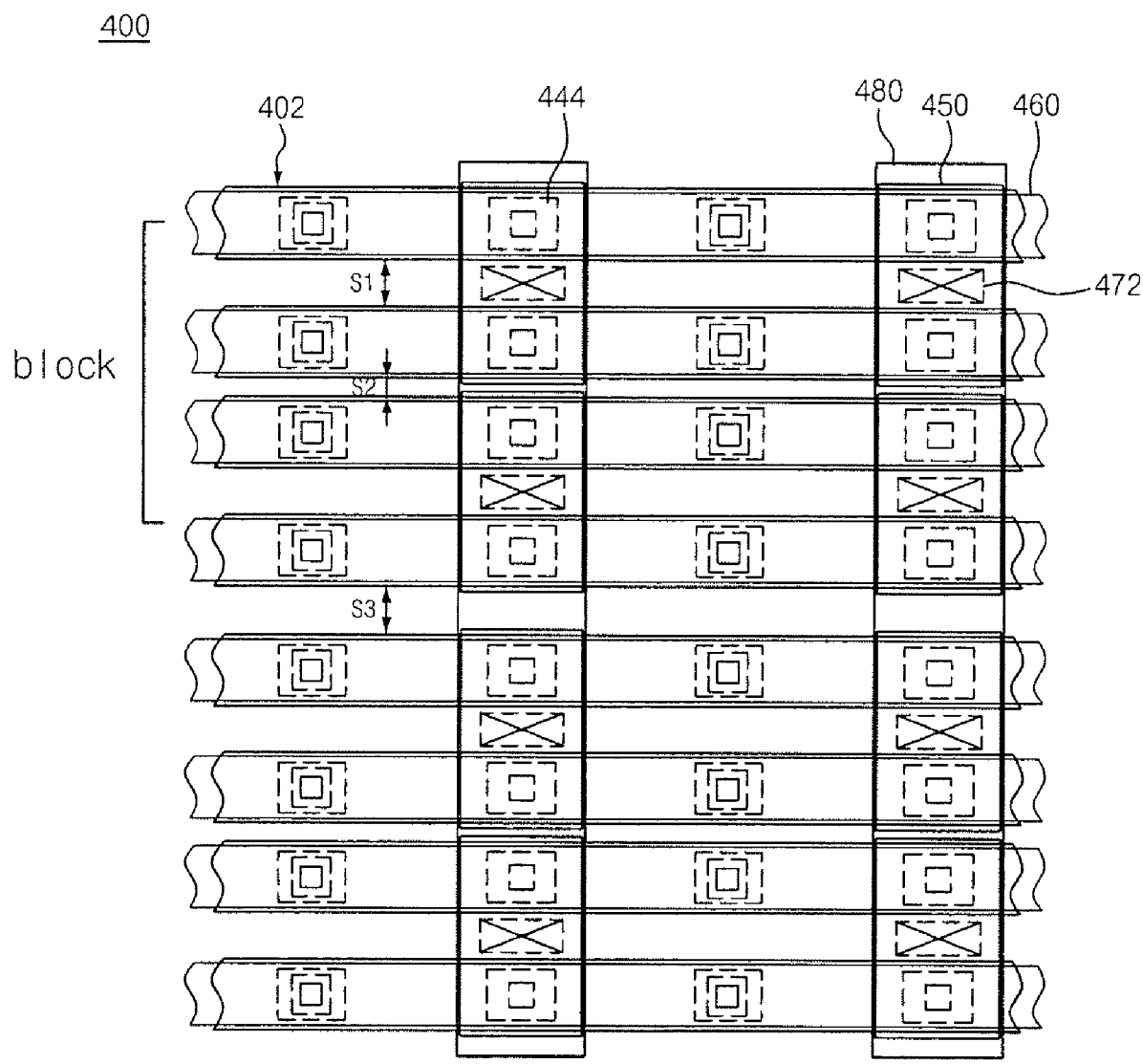
FIG. 4 is a plan view illustrating a phase change memory device in accordance with another embodiment of the present invention.

FIG. 4 is a plan view illustrating a phase change memory device in accordance with another embodiment of the present invention.

Referring to FIG. 4, in a phase change memory device according to the embodiment shown in FIG. 4, in the aforementioned embodiment, each sub bit line 450 was formed to come into contact with four second contact plugs aligned in the second direction in a block. However, in the present embodiment, a sub bit line is instead formed to only come into contact only with a pair of upper electrode 444. Each of the upper electrodes 444 is located in one of the active regions 402 in a pair of active regions 402. As previously explained, the two active regions in a pair of active regions are separated by a first interval S1.

Here, the active regions 402 are arranged in the same manner as the aforementioned embodiment. Each active region 402 in a pair of active regions 402 are spaced apart from each other by a first interval St, and a pair of active regions 402 is spaced apart from another pair of active regions 402 by the second interval S2. The four active regions 402 then constitute one block. However, in the present embodiment, the first interval St between each pair of active regions 402 is designed to be greater than the second interval S2 (instead of the second interval S2 being greater that the first interval S1) to secure a contact margin between the upper electrodes 444 and the fourth contact plugs 472. Accordingly, each fourth contact plug 472 is formed to come into contact with the portion of the sub bit line 450 that is located in the first interval S1 between each pair of active regions 402 (whereas in the previous embodiment, the fourth contact pug 472 was formed to come into contact with the portion of the sub bit line 450 located in the SECOND interval S2).

The remaining component elements are configured in substantially the same manner as those of the aforementioned embodiment, and a method for manufacturing the phase change memory device is substantially the same as that of the aforementioned embodiment except the process of forming the sub bit lines. Therefore, the detailed description for the remaining component elements and the method for manufacturing the phase change memory device will be omitted herein.

In FIG. 4, the unexplained reference numeral 460 designates a word line, and 480 a main bit line.

As is apparent from the above description, in the phase change memory device according to the present embodiment, the sensing margin of a main bit line can be widened as a result of the sub bit line being formed in a stack pattern including a phase change layer and an upper electrode, where the sub bit line is formed of a material with a lower resistance than the upper electrode.

Also, in the present embodiment, the formation of a sub bit line allows the upper electrode to be formed with a decreased thickness. Therefore, the etching time of the upper electrode material and the phase change material can be decreased. As a result, the etch loss and resultant change of the composition of the phase change layer can be prevented leading to the reduction in the variation of the programming current of the phase change memory device. Thus, the characteristics of the phase change memory device can be improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A phase change memory device comprising:
   a semiconductor substrate having a plurality of spaced apart bar-shaped active regions which extend in a first direction, wherein the bar-shaped active regions are arranged such that
   each active region in a pair of active regions is spaced apart from one another by a first interval, and
   a pair of active regions is spaced apart from another pair of active regions by a second interval, wherein each two pair of active regions constitute one block, and a plurality of blocks are spaced apart from one another by a third interval;

base regions and emitter regions formed in each active region, wherein the base and emitter regions are alternately formed and are spaced apart from one another;

lower electrodes formed over the emitter regions, wherein each of the lower electrodes is connected to the respective emitter region;

a phase change layer and an upper electrode stacked on each of the lower electrodes;

a plurality of sub bit lines formed over the upper electrodes and extending in second direction that is perpendicular to the first direction, wherein the sub bit lines connect to the corresponding upper electrodes;

a plurality of word lines formed over the sub bit lines, wherein each word line extends in the second direction and connects to the base regions located on the corresponding active region; and a plurality of main bit lines formed over the word lines, wherein each main bit line extends in the second direction and connects to the corresponding sub bit line where each of the sub bit lines, which come into contact with the main bit line is formed to come into contact with four upper electrodes arranged in each block.

2. The phase change memory device according to claim 1, wherein the base region comprises an N-type impurity region, and the emitter region comprises a P-type impurity region.

3. The phase change memory device according to claim 1, wherein the base region is formed deeper than the emitter region.

4. The phase change memory device according to claim 1, further comprising:
metal silicides formed on surfaces of the base regions and the emitter regions.

5. The phase change memory device according to claim 1, further comprising:
first contact plugs both
formed on the base regions, wherein the first contact plug is connected to the corresponding word line, and interposed between each of the emitter regions and the corresponding lower electrode.

6. The phase change memory device according to claim 5, wherein the lower electrodes formed on the first contact plugs have the shape of a plug.

7. The phase change memory device according to claim 1, further comprising:
conductive patterns interposed between each of the first contact plugs and the corresponding lower electrode.

8. The phase change memory device according to claim 1, wherein the phase change layer and the upper electrode have a rectangular or square shape.

9. The phase change memory device according to claim 1, further comprising:
second contact plugs interposed between each of the upper electrodes and the corresponding sub bit line.

10. The phase change memory device according to claim 1, wherein the sub bit lines are formed of a material which has lower resistance than the upper electrodes.

11. The phase change memory device according to claim 5, further comprising:
third contact plugs interposed between each of the first contact plugs on the base regions and the corresponding word line.

12. The phase change memory device according to claim 11, wherein the third contact plugs have a smaller size than the first contact plugs.

13. The phase change memory device according to claim 1, wherein the word line has a width which is equal to or less than that of the bar-shaped active region.

14. The phase change memory device according to claim 11, further comprising:
fourth contact plugs interposed between the sub bit lines and the main bit line.

15. The phase change memory device according to claim 14, wherein the fourth contact plugs are formed to be placed in the second interval between the active regions.

16. The phase change memory device according to claim 15, wherein the second interval is greater than the first interval.

17. A phase change memory device comprising:
a semiconductor substrate having a plurality of spaced apart bar-shaped active regions which extend in a first direction, wherein the bar-shaped active regions are arranged such that:
each active region in a pair of active regions is spaced apart from one another by a first interval,
a pair of active regions is spaced apart from another pair of active, regions by a second interval, wherein each two pair of active regions constitute one block, and
a plurality of blocks are spaced apart from one another by a third interval;

base regions and emitter regions formed in each active region, wherein the base and emitter regions are alternately, formed and are spaced apart from one another;

lower electrodes formed over the emitter regions, wherein each of the lower electrodes is connected to the respective emitter region;

a phase change layer and an upper electrode stacked on each of the lower electrodes;

a plurality of sub bit lines formed over the upper electrodes and extending in second direction that is perpendicular to the first direction, wherein the sub bit lines connect to the corresponding upper electrodes;

a plurality of word lines formed over the sub bit lines, wherein each word line extends in the second direction and connects to the base regions located on the corresponding active region; and a plurality of main bit lines formed over the word lines, wherein each main bit line extends in the second direction and connects to the corresponding sub bit line; and fourth contact plugs interposed between the sub bit lines and the main bit line, wherein each of the sub bit lines, which come into contact with the main bit line is formed to come into contact with two upper electrodes arranged in two respective active regions which are spaced apart from each other by the first interval.

18. The phase change memory device according to claim 17, wherein the fourth contact plugs are formed to be placed in the first interval between the active regions.

19. The phase change memory device according to claim 18, wherein the first interval is greater than the second interval.

* * * * *